(12) United States Patent
Sommer et al.

(10) Patent No.: US 6,240,133 B1
(45) Date of Patent: May 29, 2001

(54) HIGH STABILITY FAST TRACKING ADAPTIVE EQUALIZER FOR USE WITH TIME VARYING COMMUNICATION CHANNELS

(75) Inventors: Naftali Sommer, Rishon Lezion; Ofir Shalvi, Ramat Hasharon; Mordechai Segal, Herzlia, all of (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/245,117

(22) Filed: Feb. 4, 1999

Related U.S. Application Data

(60) Provisional application No. 60/073,760, filed on Feb. 5, 1998.

(51) Int. Cl.[7] .................................................. H03H 7/30
(52) U.S. Cl. ........................ 375/232; 375/233; 333/28 R
(58) Field of Search .................................... 375/232, 233, 375/229; 333/18, 28 R

(56) References Cited

U.S. PATENT DOCUMENTS

| | | | |
|---|---|---|---|
| 5,267,265 | * 11/1993 | Mizoguchi | 375/233 |
| 5,692,006 | * 11/1997 | Ross | 375/140 |
| 5,778,055 | * 7/1998 | Paneth et al. | 379/93.31 |
| 5,880,645 | * 3/1999 | Everitt et al. | 333/18 |
| 6,012,161 | * 1/2000 | Ariyavisitakul et al. | 375/233 |

FOREIGN PATENT DOCUMENTS

WO 92/17952  10/1992 (WO).

OTHER PUBLICATIONS

Digital Television Standard, Annex D, Advanced Television Systems Committee (ATSC) Sep. 16, 1995.

Sections 10.3 and 11.1 of J. Proakis, "Digital Communications," McGraw Hill, Third Edition, 1995.

Sections 10.1.5 through 10.1.8 of R. Gitlin, J. Hayes, S. Weinstein, "Data Communications Principles," Plenum Press, 1992.

* cited by examiner

Primary Examiner—Temesghen Ghebretinsae
(74) Attorney, Agent, or Firm—Dwight N. Holmbo; Wade James Brady, III; Frederick J. Telecky, Jr.

(57) ABSTRACT

An adaptive equalizer capable of tracking rapid channel variations while maintaining high stability and low jitter, and a receiver constructed therefrom. A novel feature of the invention is that is that the equalizer is sectioned, that is constructed from a plurality of feed-forward sections and decision-feedback sections, where these sections comprise a cascade of an adaptive linear filter and an adaptive multiplier. This structure is effective at combating rapid channel variations, which are a result of delay variations of the reflections of the signal, e.g., airplane flutter, without sacrificing the stability and the accuracy of the equalizer even in cases where the equalizer has a large number of taps. The different equalizer sections may have different step size parameters. A controller monitors the channel variations and adjusts the step size parameters of each section accordingly. The controller increases the step size of the equalizer sections that are able to compensate for the variation of the channel and does not increase the step sizes of the other sections. This allows the equalizer to combat rapid channel variations without sacrificing stability and accuracy. The present invention is particularly suitable to high speed wireless RF digital communications applications, e.g., to DTV broadcast applications, where the equalizer is characterized by a large number of taps and the signal is subject to rapid time varying reflections due to movement of objects such as cars and airplanes.

20 Claims, 5 Drawing Sheets

HIGH STABILITY FAST TRACKING ADAPTIVE EQUALIZER FOR USE WITH TIME VARYING COMMUNICATION CHANNELS

This application claims benefit of Provisional Appl. Ser. No. 60/073,760, filed Feb. 5, 1998.

FIELD OF THE INVENTION

The present invention relates generally to digital communications systems and more particularly relates to a highly stable, fast tracking equalizer suitable for use in combating time varying channels within a digital communications system.

BACKGROUND OF THE INVENTION

Channel Reflections and Digital Television Signals

In the coming years digital television broadcasting will take on more and more of a dominant role in television broadcasting. Public broadcasting of digital television signals has already begun the United States. Some time in the early 2000s, it is forecasted that the broadcasting of most analog television signals will cease and will be replaced by TV signals that are digital in nature, whether over terrestrial links, i.e., over the air, cable or satellite.

A problem associated with the transmission of terrestrial digital TV signals is signal reflections. Signal reflections can be caused by many factors including stationary objects such as buildings and moving objects such as airplanes.

Weak reflections that are generated relatively close to the receiver to not pose as nearly as much of a problem as strong reflections that are generated relatively far away from the receiver. The latter type of reflections being very problematic to the reception of digital signals such as digital TV signals.

Channel reflections are another common form of linear distortion ISI which constitute a common impairment in digital communications channels. They can, however, be negated by employing an equalizer in the receiver.

In many cases the amplitude level and the time delay of the reflections are time varying. These amplitude level and the time delay variations are associated typically with wireless transmission, where they may result from movement of objects which reflect the transmitted signals. In order to compensate for this type of noise, the receiver must track the channel variations and adapt the parameters of the equalizer accordingly.

Decision Feedback Equalizers

A problem frequently encountered in full duplex digital data communication systems that employ a limited bandwidth channel is the presence of linear distortion introduced into the signal propagation path. The linear distortion commonly manifests itself as intersymbol interference (ISI) in the received symbol sequence. In order to reduce the effects of this distortion, it is common practice in the signal processing art to process the received signals by some form of linear and non-linear filter mechanism, such as a decision feedback equalizer (DFE).

The samples are then fed to a feed forward linear filter section. The first forward linear filter comprises a delay line, i.e., $z^{-1}$, and each stage of which stores a respective symbol sample. The contents of the respective stages of the delay line are multiplied by respective weighting coefficients $W_i$ and then summed in an adder, to yield a combined output. This output can be applied to a downstream decision feedback section, from which output data decisions are derived.

The output of the adder is adjusted by subtracting the output of the decision feedback section from the output of the adder. The effect of subtracting the output of the decision feedback section from the linear filtered section is to remove intersymbol interference due to previously detected symbols.

Note that data decision estimates are derived on a symbol by symbol basis by means of a symbol decision mechanism, such as a symbol slicer. The symbol slicer functions to slice the signal at equally spaced levels between reference levels for the received symbols. These output data decisions are then fed back to a linear delay line to remove intersymbol interference from future symbols. The contents of the respective $z^{-1}$ stages of the delay line are multiplied by respective weighting coefficients and then summed in an adder to produce a combined output to be substracted from the output of feed forward section.

A residual error signal for adjusting the weighting coefficients of the linear section and the decision feedback section of the filter may be obtained by differentially combining data decision estimates at the output with the output of the summation block. In the ideal conventional DFE equalizer architecture the weighting coefficients $W_i$ for the feed forward filter section are assumed to be one-sided, i.e., anticausal, and the last, or most delayed, tap $z^{-1}$ of the delay line is typically the largest and is commonly referred to as the main tap, reference tap or the cursor tap. The current decision on the value of a received symbol is customarily considered to have its dominant energy contribution derived through this tap. The weighting taps of the feedback section take on values equal to samples of the postcursor or 'tail' of the received symbol which follows as the symbol energy decays.

Since the classical DFE structure assumes that the number of taps or stages is infinite, practical realization requires truncating the lengths of the respective feed forward and feed back delay lines at some practical number of taps per filter. In order to prevent significant degradation of the signal, the number of taps selected for the feedback stage must be sufficient to span all significant samples of the signal at the point of ISI cancellation. The number of taps of the upstream stage is not as readily apparent.

Although this number is related to the precursors, it is not necessarily equal to the significant energy span of the precursors. One method to establish the length of the filter is to either compute the coefficients or simulate the filter with a large number of coefficients and determine how many are significant. This approach, however, is heavily channel dependent since, in practice, the signal processing circuit designer does not have the freedom to implement a 'whitened' matched filter in the analog domain prior to sampling, which would be different for every line shape and noise spectrum. Ultimately, some prescribed fixed shaped is employed, or a simple anti aliasing filter may be used upstream of the sampling point.

In order to train the adaptive equalizer, data values or symbols corresponding to the transmitted data are used. Training is normally carried out using a predetermined training sequence. Alternatively, if the data decisions are sufficiently reliable prior to convergence, these data decisions can be used for training. When a training sequence is employed it is common practice to derive a rough approximation of the amount of delay and allow the taps to grow until the largest tap is identified. Then the amount of delay is adjusted so as to place the cursor tap at the desired location that is the last stage of the feed forward delay line.

Prior art solutions, such as that described above, are limited in their ability to track fast time variations in channels having reflections with large delays. To compensate for the linear distortion in such channels, an equalizer with a large number of parameters is needed, making fast tracking of channel variations difficult (and sometimes even not feasible). For example, a terrestrial digital television (DTV) signal may have reflections of up to 20 microseconds. If a linear equalizer or a decision feedback equalizer (DFE) is used to combat such reflections, then at least 200 taps will be required. These reflections may originate from a moving airplane, in which case they can vary significantly within a period of 10000 symbols, and thus be very difficult to track when using a prior art equalizer architecture.

SUMMARY OF THE INVENTION

This present invention is an adaptive equalizer structure and an equalization method that permits fast tracking of time varying reflections without sacrificing the stability of the equalizer. The ability to track fast variations in due in part to the sectioning of the equalizer into small filtering sections. The equalizer identifies sections of the equalizer that need to be adjusted rapidly due to channel variations and, consequently, the adaptation rate of the parameters of these sections is then increased.

Each equalizer section has an adaptive phase rotator (in QAM receivers) or an adaptive gain (in VSB or PAM receivers). One can show that the effect of reflection-delay variation when the signal is transmitted at a high RF frequency can essentially be compensated for by rapid adaptation of only the phase (or gain) parameter in the relevant sections, while all the other parameters of the equalizer do not need to be adjusted rapidly. This is also exploited by the equalizer to allow tracking fast channel variations using a relatively small number of parameters.

The adaptive equalizer is also used to construct a RF receiver. The equalizer is constructed from a plurality of feed forward equalizer (FFE) sections and a plurality of decision feedback equalizer (DFE) sections. A novel feature of the invention is that the equalizer is divided into a plurality of sections wherein separate taps and gain parameters are associated each section that can be set independently from the other equalizer sections. A controller monitors each equalizer section and in response thereto, adjusts the equalizer section parameters accordingly. This permits the equalizer to very quickly track reflections and other linear noise sources without sacrificing stability and jitter.

The outputs of the FFE and DFE sections are summed and input to an error calculator and a symbol slicer. The output of the symbol slicer is fed back into the first DFE section. The output of the error calculator is input to each FFE and DFE section and used in generating each respective output.

In operation, when reflections are detected, the parameters of only the section corresponding to the time span of the reflections are modified. The step size for the equalizer section corresponding to the reflection is made larger thus achieving faster tracking while the other equalizer sections remain unchanged or adapted at a slower rate.

An equalizer controller function determines the step size for each equalizer section. The controller assigns a large step size only to some of the equalizer sections while assigning the other sections a small step size. This provides a fast tracking rate for the sections associated with the reflection while maintaining stability and low noise thus optimizing the performance of the equalizer.

Each equalizer section is comprised of a plurality of delay line cells and a plurality of adaptive multipliers. Each delay line cell is associated with one adaptive multiplier. The outputs of the adaptive multipliers are summed and input to an adaptive multiplier that generates the data output of each equalizer section.

There is provided in accordance with the present invention an adaptive equalizer having an input and an output, the equalizer for equalizing a receiver signal input thereto comprising a plurality of feed forward equalizer (FFE) sections, at least one feed forward equalizer section having tap coefficients and step size parameters that are adjustable separately for each the feed forward equalizer section independent of the tap coefficients and step size parameters of other feed forward equalizer sections, a plurality of decision feedback equalizer (DFE) sections, at least one decision feedback equalizer section having tap coefficients and step size parameters that are adjustable separately for each the decision feedback equalizer section independent of the tap coefficients and step size parameters of other decision feedback equalizer sections, a summation unit operatively coupled to the outputs of the plurality of FFE sections and the plurality of DFE sections, the summation unit adapted to add the outputs so as to generate a soft decision output, a symbol slicer operatively coupled to the output of the summation unit and adapted to generate estimated symbols yielding a hard decision output, an error calculation unit operatively coupled to the output of the summation unit adapted to generate an estimated error signal and a controller operatively coupled to the plurality of FFE sections and the plurality of DFE sections, the controller adapted to generate the step size parameters for each FFE section and DFE section in response to sensing variations in the linear distortion of the receiver signal which can be compensated for by the FFE and DFE sections.

The feed forward equalizer section comprises a linear adaptive digital filter operating on the input of the equalizer delayed in time and generating an output therefrom, the linear adaptive digital filter including a plurality of coefficients, an adaptive gain multiplier operating on the output of the linear adaptive digital filter, the adaptive gain multiplier including a gain coefficient, a first step size parameter for adapting the plurality of coefficients of the linear adaptive digital filter, a second step size parameter for adapting the gain coefficient of the adaptive gain multiplier and wherein the first step size parameter and the second step size parameter are set independently for each the FFE section.

The decision feedback equalizer section comprises a linear adaptive digital filter operating on the estimated symbols delayed in time and generating an output therefrom, the linear adaptive digital filter including a plurality of coefficients, an adaptive gain multiplier operating on the output of the linear adaptive digital filter, the adaptive gain multiplier including a gain coefficient, a first step size parameter for adapting the plurality of coefficients of the linear adaptive digital filter, a second step size parameter for adapting the gain coefficient of the adaptive gain multiplier and wherein the first step size parameter and the second step size parameter are set independently for each the DFE section.

The controller comprises processing means programmed to sense the magnitudes of gradient outputs generated by each the FFE section and each the DFE section and adjust the step size parameters within those FFE and DFE sections having high gradient magnitudes so as to allow fast adjustment of tap coefficients.

The controller comprises processing means programmed to monitors the tap coefficients associated with each the FFE section and each the DFE section, detect the time variation of the coefficients, normalize the time variation with the step size parameters for a section, adjust the step size parameters within these FFE and DFE sections having large time variations so as to allow fast adjustment of tap coefficients.

The controller comprises processing means programmed to set large values for the step size parameters in a FFE or DFE section that is expected to have large or fast time varying tap coefficients and set small values for the step size parameters in a FFE or DFE section that is expected to have small or slow time varying tap coefficients.

The tap coefficients of each FFE section are adapted in accordance with the cross correlation between the input to the FFE section and the estimated error signal. The gain coefficient of each FFE section is adapted in accordance with the cross correlation between the input to the adaptive gain multiplier and the estimated error signal. The tap coefficients of each DFE section are adapted in accordance with the cross correlation between the input to the DFE section and the estimated error signal. The gain coefficient of each DFE section is adapted in accordance with the cross correlation between the input to the adaptive gain multiplier and the estimated error signal. The tap coefficients in each FFE section are adapted such that they converge to a solution wherein the magnitudes of the tap coefficients are close to a predetermined value.

There is also provided in accordance with the present invention a communications receiver for receiving transmission that are transmitted within a communications system comprising a sensor for receiving the transmitted signals, a front end unit adapted to receive the output of the sensor, the front end unit operative to downconvert, filter and amplify the transmitted signal so as to generate an baseband signal, an adaptive equalizer having an input and an output and adapted to receive the baseband signal, the adaptive equalizer comprising a plurality of feed forward equalizer (FFE) sections, at least one feed forward equalizer section having tap coefficients and step size parameters that are adjustable separately for each the feed forward equalizer section independent of the tap coefficients and step size parameters of other feed forward equalizer sections, a plurality of decision feedback equalizer (DFE) sections, at least one decision feedback equalizer section having tap coefficients and step size parameters that are adjustable separately for each the decision feedback equalizer section independent of the tap coefficients and step size parameters of other decision feedback equalizer sections, a summation unit operatively coupled to the outputs of the plurality of FFE sections and the plurality of DFE sections, the summation unit adapted to add the outputs so as to generate a soft decision output, a symbol slicer operatively coupled to the output of the summation unit and adapted to generate estimated symbols yielding a hard decision output, an error calculation unit operatively coupled to the output of the summation unit adapted to generate an estimated error signal, a controller operatively coupled to the plurality of FFE sections and the plurality of DFE sections, the controller adapted to generate the step size parameters for each FFE section and DFE section in response to sensing variations in the linear distortion of the receiver signal which can be compensated for by the FFE and the DFE sections, a demodulator operative coupled to the output of the adaptive equalizer and a detector operatively coupled to the output of the demodulator and adapted to generate binary output data.

There is further provided in accordance with the present invention an adaptive filter having an input and an output, the filter for filtering an input signal comprising a plurality of filter sections, at least one filter section having tap coefficients and step size parameters that are adjustable separately for each the filter section independent of the tap coefficients and step size parameters of other filter sections, a summation unit operatively coupled to the outputs of the plurality of filter sections, the summation unit adapted to add the outputs so as to generate a soft decision output, an error calculation unit operatively coupled to the output of the summation unit adapted to generate an estimated error signal and a controller operatively coupled to the plurality of filter sections, the controller adapted to generate the step size parameters for each filter section in response to sensing variations in the linear distortion of the input signal which can be compensated for by the filter sections.

The filter section comprises a linear adaptive digital filter operating on the input of the adaptive filter delayed in time and generating an output therefrom, the linear adaptive digital filter including a plurality of coefficients, an adaptive gain multiplier operating on the output of the linear adaptive digital filter, the adaptive gain multiplier including a gain coefficient, a first step size parameter for adapting the plurality of coefficients of the linear adaptive digital filter, a second step size parameter for adapting the gain coefficient of the adaptive gain multiplier and wherein the first step size parameter and the second step size parameter are set independently for each the filter section.

Still further, there is provided in accordance with the present invention an echo canceling device comprising an adaptive filter having an output, and an input adapted to receive an outgoing signal, the adaptive filter adapted to generate an estimated echo signal, the adaptive filter comprising a plurality of filter sections, at least one filter section having tap coefficients and step size parameters that are adjustable separately for each the filter section independent of the tap coefficients and step size parameters of other filter sections, a summation unit operatively coupled to the outputs of the plurality of filter sections, the summation unit adapted to add the outputs so as to generate a soft decision output, an error calculation unit operatively coupled to the output of the summation unit adapted to generate an estimated error signal, a controller operatively coupled to the plurality of filter sections, the controller adapted to generate the step size parameters for each filter section in response to sensing variations in the linear distortion of the input signal which can be compensated for by the filter sections and a summer adapted to sum together a first signal and a second signal so as to generate an echo free signal, the first signal comprising the sum of an echo generated by time varying reflections and an incoming signal source, the second signal comprising the output of the adaptive filter.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| ATSC | Advanced Television Systems Committee |
| ATV | Advanced Television |
| CAP | Carrierless Amplitude/Phase Modulation |
| DFE | Decision Feedback Equalizer |
| DTV | Digital Television |
| FFE | Feed Forward Equalizer |
| ISI | Intersymbol Interference |
| PAM | Pulse Amplitude Modulation |
| PSK | Phase Shift Keying |
| QAM | Quadrature Amplitude Modulation |
| RF | Radio Frequency |
| UHF | Ultra High Frequency |
| VHF | Very High Frequency |
| VSB | Vestigial Sideband Modulation |

General Description

Figure 1:
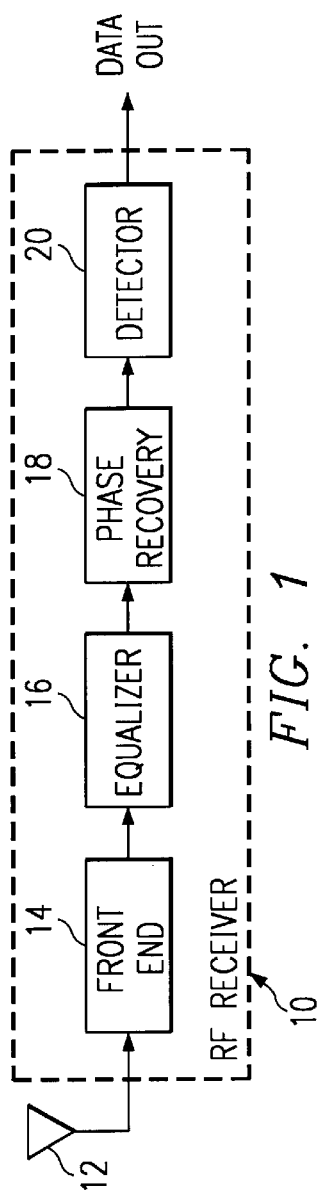
FIG. 1 is a block diagram illustrating the architecture of a typical receiver that includes an equalizer and is used to generate a data output signal from an input RF signal.

A block diagram illustrating the architecture of a typical receiver that includes an equalizer and is used to generate a data output signal from an input RF signal is shown in FIG. 1. The receiver, generally referenced 10, may be used to receive digital television (DTV) signals. The invention, however, is not limited to use with DTV signals. The invention has application in any communication system that utilizes equalization, either FFE or DFE, in the receiver, such as systems using QAM, PAM, CAP and PSK modulations.

The DTV receiver 10 is constructed to receive Vestigial Side Band (VSB) modulated signals in accordance with the terrestrial TV standard specified in Digital Television Standard, Annex D, Advanced Television Systems Committee (ATSC) Sep. 16, 1995, incorporated herein by reference.

The receiver 10 comprises a sensor 12, such as an antenna, suitable for receiving television RF frequencies and a front end unit 14, i.e., a tuner, which amplifier the signal received from the antenna, downconverts it from VHF or UHF band to baseband, filters the out-of-band signals, performs analog to digital conversion (ADC), performs gain control and estimates and compensates for carrier and symbol clock phase and frequency errors.

The output of the front-end unit 14 is sampled at the symbol rate of 10.76 MHz. The sampled output is then equalized by the adaptive equalizer unit 16 that functions to compensate for reflections, linear distortions and colored noise. The adaptive equalizer unit 16 also functions to track variations in the channel distortion and is capable of tracking quickly varying reflections.

The output of the equalizer 16 is fed into a phase recovery unit 18 which is capable of tracking and recovering carrier phase rotations due to various factors such as tuner phase noise. The output of the phase recovery unit 18 is then input to a detection unit 20 which functions to detect the transmitted data utilizing a decoder for the Trellis channel code and the Reed-Solomon error correction code as defined in the Digital Television Standard, Annex D, specified above.

Figure 2:
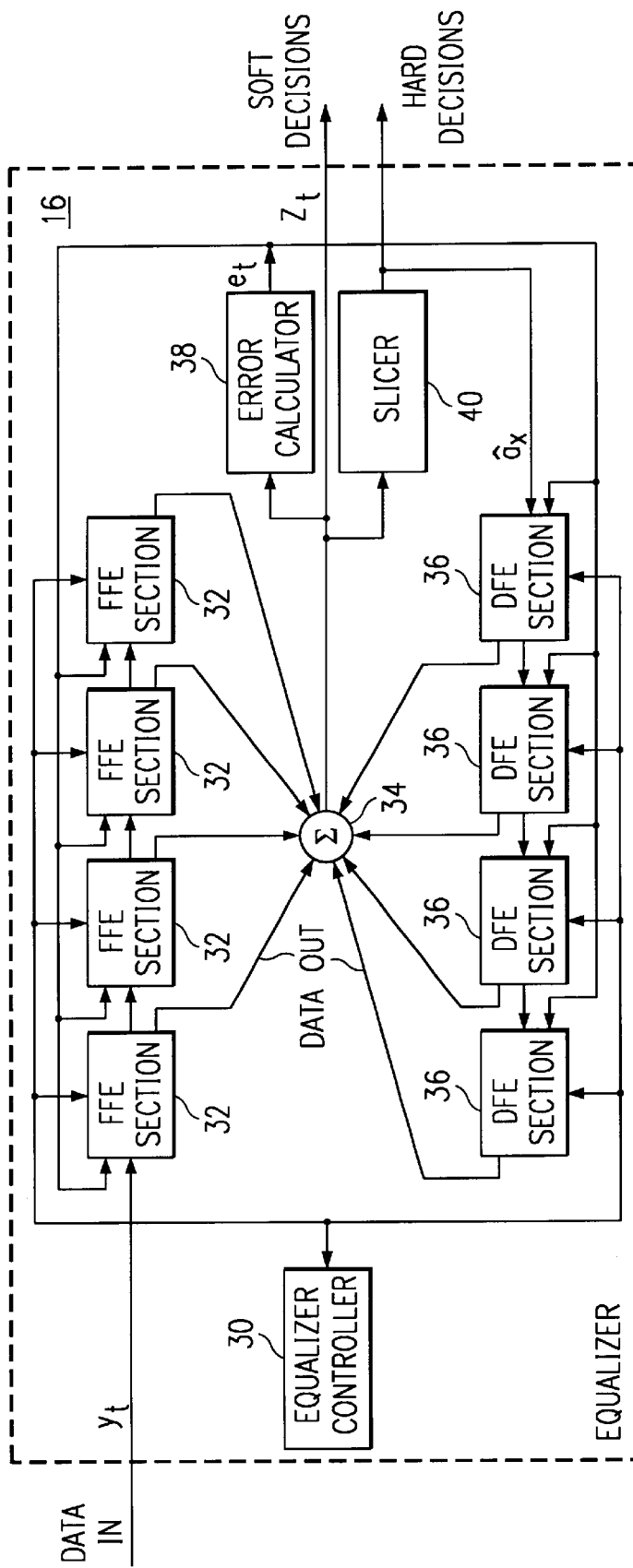
FIG. 2 is a block diagram illustrating an equalizer constructed in accordance with the present invention capable of fast tracking of signal containing time varying reflections.

A block diagram illustrating an equalizer constructed in accordance with the present invention capable of fast tracking of signal containing time varying reflections is shown in FIG. 2. The equalizer 16 of the present invention is based on the well-known decision feedback equalizer architecture. Details of the construction and operation of decision feedback equalizers and adaptive equalization techniques can be found in Sections 10.3 and 11.1 of J. Proakis, "Digital Communications," McGraw Hill, Third Edition, 1995, and in Sections 10.1.5 through 10.1.8 of R. Gitlin, J. Hayes, S. Weinstein, "Data Communications Principles," Plenum Press, 1992, both of which are incorporated herein by reference.

The equalizer 16 comprises a plurality of feedforward equalizer (FFE) sections 32 and a plurality of decision feedback equalizer (DFE) sections 36. In the example equalizer shown in FIG. 2, four FFE and four DFE sections are used. Input data $y_t$ is input to the first FFE section. The input data passes through multiple delay registers in each section 32.

In accordance with the present invention any number of FFE and DFE sections may be used without departing from the spirit of the invention. In addition, the number of FFE and DFE section may be different and are not related to each other. Equalizers can be constructed that have no FFE or DFE sections at all, but may suffer from reduced performance.

The data outputs from each FFE and DFE section are input to a summer 34 whose sum output $z_t$ forms the soft decision output of the equalizer. The output of the summer 34 is also input to an error calculator 38 whose output $e_t$ is fed to each FFE and DFE section. The output of the summer 34 is also input to a slicer 40 that functions to make decisions about each symbol. The output $a_t$ of the slicer forms the hard decision output and is input to the first DFE section. An equalizer controller 30 coordinates and controls the operation of the individual components of the equalizer 16.

In operation the equalizer 16 generates a sequence $z_t$ which is an approximation of the transmitted symbols. The sequence $z_t$ is a linear combination of the equalizer input sequence $y_t$ and a sequence of estimated symbols $â_t$, generated by the symbol slicer 40 using a zero-delay detection algorithm such as the memoryless nearest neighbor decision rule taught by Proakis. The linear combination is generated by the feed forward equalizer (FFE) sections 32, decision feedback equalizer (DFE) sections 36 and the summation unit 34. The sequence $z_t$ is used by the error calculator 38 to generate an error sequence $e_t$ that is used by the FFE sections 32 and the DFE sections 36 for parameter adaptation channel variation tracking.

The equalizer controller 30 functions to sense the rate of change of the coefficients in each of the sections and increase or decrease the step size parameters of the section accordingly. If the controller senses high gradient magnitudes from one or more FFE and DFE sections, it adjusts the step sizes of those sections accordingly in order to allow fast adjustment of those sections. In addition, the controller functions to monitor the tap coefficients of each FFE and DFE section, detect the time variation of the tap coefficients, normalize the time variations by the step size of the particular section and adjust the step sizes of sections with large time variations so as to permit fast adjustment of the tap coefficients. Further, the controller sets large step sizes for any FFE or DFE section that is expected to have large or fast time varying filter coefficients. Conversely, the controller sets small step sizes for any FFE or DFE section that is expected to have small or slowly time varying filter coefficients.

The FFE sections are useful for canceling non-causal signals such as reflections that occur before the main signal. Although infrequent, this situation may occur in areas such as crowded cities with tall buildings and in areas with particular geological arrangements. The DFE sections are useful for canceling causal signal such as reflections that occur after the main signal. As described above, this may be caused by reflections off airplanes particularly at receiver locations within a few miles of an airport. Note that a transmitted signal may be reflected more than once resulting in reception of a main signal and multiple reflected signals each delayed in time and having different amplitudes. In the case of DTV signals, reflections may occur up to 40 microseconds that correspond to a few miles. At a data rate of 10 Msps, this time delay represents 400 symbols.

The function of the equalizer 16 is to remove as best as possible the reflections from the received signal. Since it is not known beforehand where the reflections will be in time, the equalizer 16 is operable to learn the channel, i.e., the locations of the reflections, from the signal.

In order to be able to cancel the reflections in the received signal, the equalizer must be constructed to have a sufficient length. Thus, there must be a sufficient number of taps in the equalizer to encompass a time span long enough to include potential reflections.

In the case of DTV signals, the length of the equalizer may be relatively long having a large number of taps. Typical prior art adaptive equalizers control the taps and the step size of each tap on an equalizer wide basis. In other words, there is no individual control of each tap and its step size, the step size of all taps are controlled as a group. Note that the step size controls the speed of tracking. In this case, a tradeoff must be made between larger step size and faster tracking which leads to increased noise and low stability versus smaller step size and slower tracking which leads to lower noise. Further, it is wasteful to train an entire equalizer when only a few of the taps need to be adjusted.

The equalizer of the present invention, on the other hand, is divided into a plurality of sections (both FFE and DFE sections) whereby each section has a plurality of taps that are controlled as a separate entity. The step size for each section can be set independently from all other sections. Thus, if it is determined that only a few taps need to be adjusted rapidly, the parameters for only the equalizer sections containing those particular taps needs to be updated. The remaining equalizer sections are not changed rapidly and remain substantially unchanged.

In accordance with the present invention, when reflections are detected, only the section corresponding to the time span of the reflections needs to be modified. In this case, the step size for the equalizer section corresponding to the reflection can be made larger thus achieving faster tracking. The remaining equalizer sections can be set to have small step sizes while only the equalizer section associated with the reflection has a larger step size.

It is the function of the equalizer controller 30 to determine the step size for each equalizer section. Preferably, the controller 30 assigns only a large step size to a few equalizer sections while assigning the other sections a small step size. This provides a fast tracking rate for the sections associated with the reflection while maintaining stability and low noise since the remaining sections have a small step size. This serves to optimize the performance of the equalizer.

The equalizer controller 30 monitors the average rate of change of the parameters of each section in order to determine which section requires a larger step size. Equalizer sections with high magnitude of the gradient terms, i.e., large amounts of activity due to reflections for example, are given higher step size. If an equalizer section is not experiencing time variations, then its gradient terms are minimal, i.e., ~0.

Figure 3:
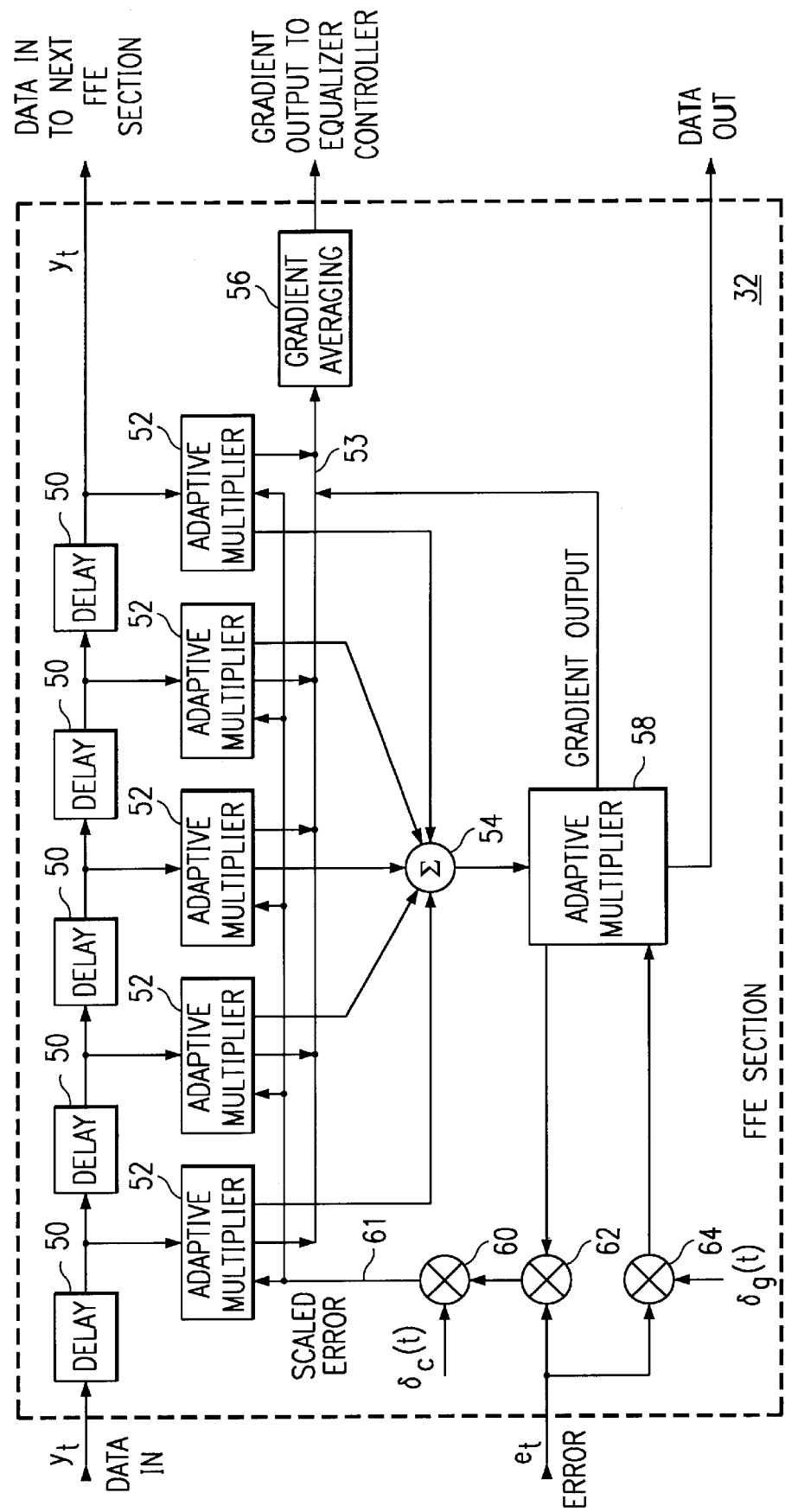
FIG. 3 is a block diagram illustrating the feed forward equalizer section of the present invention in more detail.

A block diagram illustrating the feed forward equalizer section of the present invention in more detail is shown in FIG. 3. The data input $y_t$ to the FFE section 32 is fed into the first of a plurality of delay line registers or cells 50. In the example FFE shown in FIG. 3, five delay line cells 50 are shown. Note, however, that the FFE section 32 may be constructed having any number of delay line cells. For example, the number of delay line cells ranges from 4 to 64 with 8 taps being typical.

At each symbol clock the data in the delay line formed by the plurality of delay line cells 50 is shifted to the right. The output of the rightmost delay line cell may be connected to the data input of the first delay line cell in another FFE section.

The content of each of the delay line cells is input to one of adaptive multipliers 52. The output of each adaptive multiplier is summed in summer 54. The output of the summer 54 is input to an adaptive multiplier 58 where it is multiplied by the gain associated with that particular FFE section. The output of the adaptive multiplier 58 is input to the summer 34 (FIG. 2). The coefficients of the adaptive multipliers 52 are adapted using the product of the error sequence $e_t$ and the complex conjugate of the coefficient of the adaptive multiplier 58 as output by multiplier 62. This product is then multiplied with a step size factor $\delta_c$ via multiplier 60 to generate a scaled error 61.

The coefficient of the adaptive multiplier 58 is adapted using the product of the error sequence $e_t$ and a step size factor $\delta_g$ via multiplier 64. The gradient averaging unit 56 functions to average the norm of the gradient indications 53 received from the adaptive multipliers 52 and 58 and to generate a gradient output signal which is input to the equalizer controller 30 (FIG. 2). Note that the gradient averaging unit 56 averages the norm of the gradient indications 53 both in time and over all the adaptive multipliers 52 and 58 in a particular equalizer section.

Figure 4:
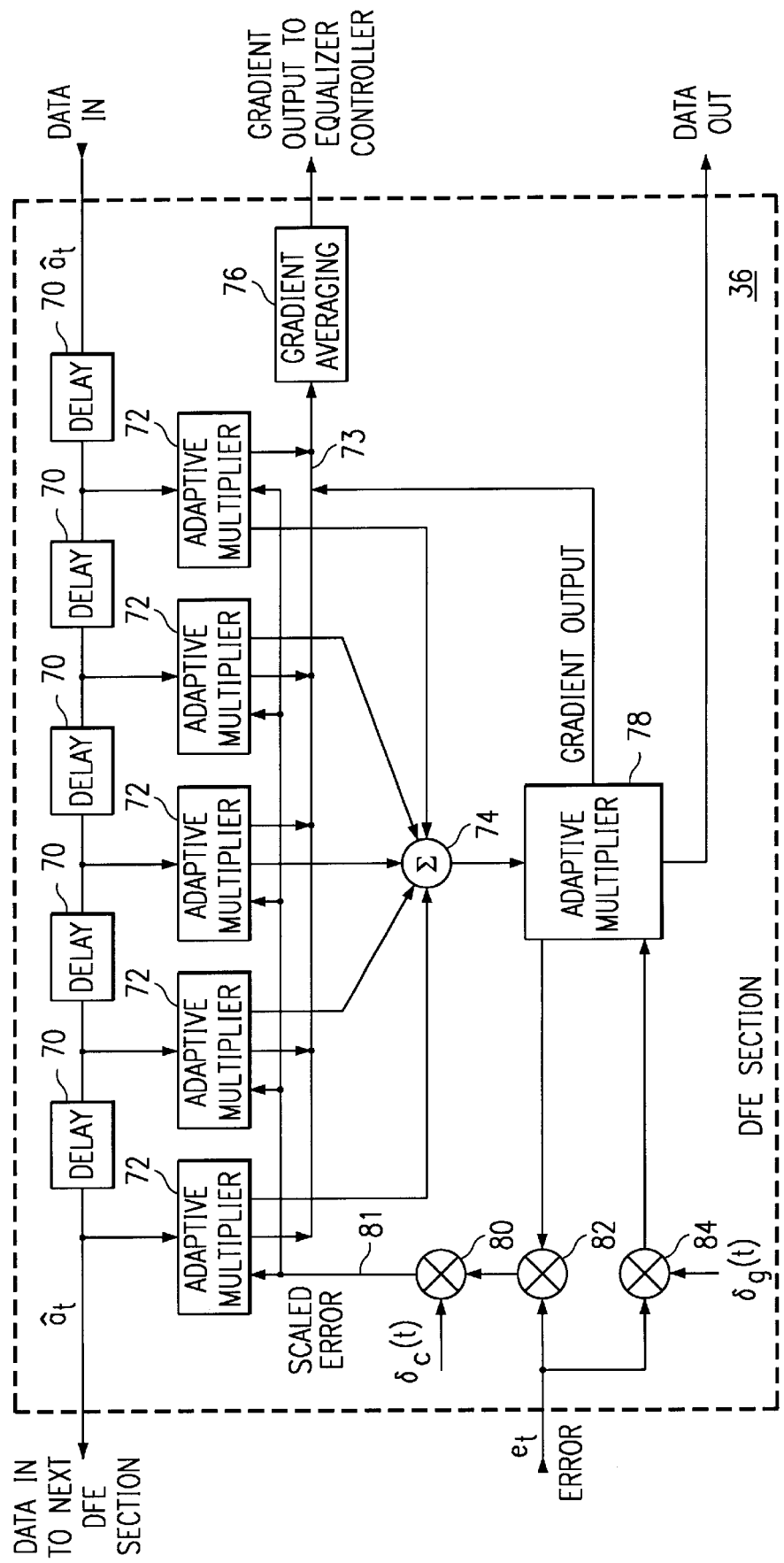
FIG. 4 is a block diagram illustrating the decision feedback equalizer section of the present invention in more detail.

A block diagram illustrating the decision feedback equalizer section of the present invention in more detail is shown in FIG. 4. The data input $â_t$ to the DFE section 36 is fed into the first of a plurality of delay line registers or cells 70. In the example DFE shown in FIG. 4, five delay line cells 70 are shown. Note, however, that the DFE section 36 may be constructed having any number of delay line cells. For example, the number of delay line cells ranges from 4 to 64 with 8 taps being typical.

At each symbol clock the data in the delay line formed by the plurality of delay line cells 70 is shifted to the left. The output of the leftmost delay line cell may be connected to the data input of the first delay line cell in a downstream DFE section.

The content of each of the delay line cells is input to one of adaptive multipliers 72. The output of each adaptive multiplier is summed in summer 74. The output of the summer 74 is input to an adaptive multiplier 78 where it is multiplied by the gain associated with that particular DFE section. The output of the adaptive multiplier 78 is input to the summer 34 (FIG. 2). The coefficients of the adaptive multipliers 72 are adapted using the product of the error sequence $e_t$ and the complex conjugate of the coefficient of the adaptive multiplier 78 as output by multiplier 82. This product is then multiplied with a step size factor $\delta_c$ via multiplier 80 to generate a scaled error 81.

The coefficient of the adaptive multiplier 78 is adapted using the product of the error sequence $e_t$ and a step size factor $\delta_g$ via multiplier 84. The gradient averaging unit 76 functions to average the norm of the gradient indications 73 received from the adaptive multipliers 72 and 78 and to generate a gradient output signal which is input to the equalizer controller 30 (FIG. 2). Note that the gradient averaging unit 76 averages the norm of the gradient indications 73 both in time and over all the adaptive multipliers 72 and 78 in a particular equalizer section.

Note that the gradient averaging unit in both FFE and DFE equalizer sections (56 FIG. 3, 76 FIG. 4) functions to generate an indication of how much the equalizer parameters (either $y_t$ or $â_t$) need to be changed. If the gradient output, as monitored by the equalizer controller 30 (FIG. 2), is large over time, it is an indication that the coefficients and gain parameters should be modified. In response, a bigger step size is given only to the equalizer section whose gradient output has increased. The remaining sections are substantially unchanged.

Note that in both FFE and DFE sections, the plurality of delay line cells and adaptive multipliers function as a linear adaptive digital filter. The tap coefficients (within each adaptive multiplier) are adapted in accordance with the cross correlation between the filter input and the estimated error signal generated by the error calculation unit 38 (FIG. 2). In addition, the gain coefficient of the adaptive multiplier that receives the output of the summation unit in each FFE and DFE section is adapted in accordance with the cross correlation between the input to the gain multiplier and the estimated error signal generated by the error calculation unit 38.

Note that in accordance with an alternative embodiment, not all the FFE and DFE sections are required to have independently adjustable tap coefficients, gain coefficients and step sizes. One or more of the equalizer sections may be constructed using standard prior art techniques.

Figure 5:
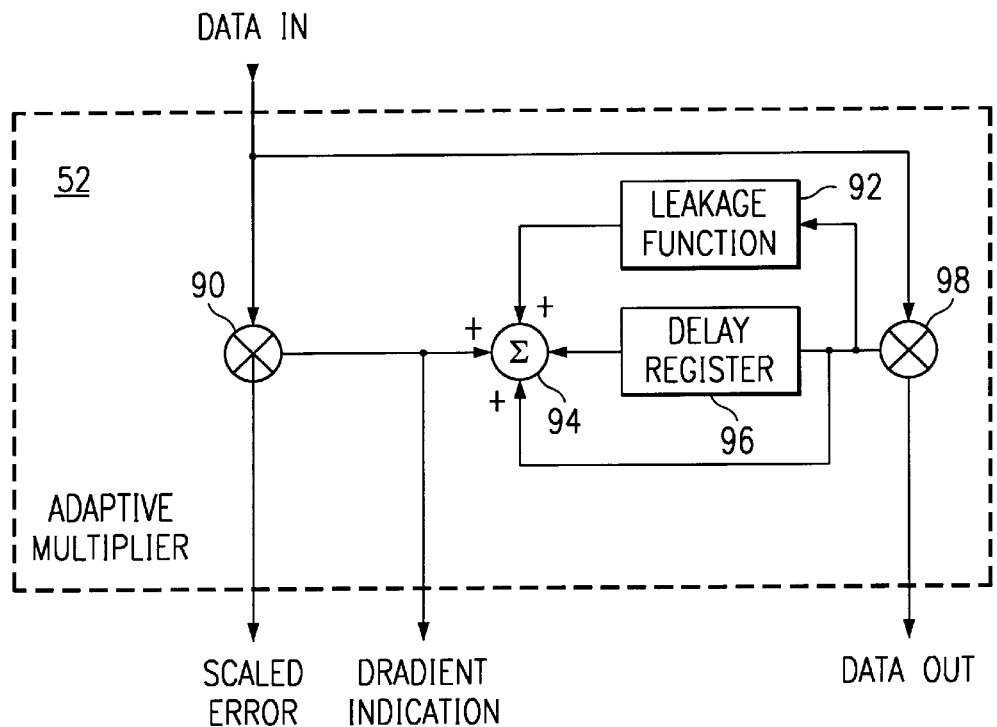
FIG. 5 is a block diagram illustrating the adaptive multiplier used to construct the equalizer of the present invention in more detail.

A block diagram illustrating the adaptive multiplier used to construct the equalizer of the present invention in more detail is shown in FIG. 5. Note that the adaptive multipliers 52 and 58 (FIG. 3) of the FFE and 72 and 78 (FIG. 4) of the DFE are substantially the same in construction and operation, thus only one of them will be described here. The adaptive multiplier 52 comprises a delay register 96 which functions to store the coefficient of the adaptive multiplier 52, leakage function 92, summer 94 and multipliers 98, 90.

The output data produced by the adaptive multiplier 52 is formed from the product of the data input and the coefficient of the adaptive multiplier, i.e., the output of delay register 96, via multiplier 98. The adaptive multiplier coefficient stored in delay register 96 is adapted by summing (1) the coefficient itself, (2) the product of the scaled error and the input data, via multiplier 90, and (3) a leakage factor generated by the leakage function 92. The leakage factor is a function of the coefficient stored in the delay register 96. The leakage function 92 is adapted to penalize values of the coefficient which are far from a desirable value and thus avoid cases such as the following:

1. The coefficients of the adaptive multipliers 52 (FIG. 3) become very large and the coefficient of the adaptive multiplier 58 becomes very small while their product does to change by much.

2. The coefficients of the FFE and DFE equalizer sections become very large while the sum of their outputs does not change by much.

Utilizing the leakage function is a well-known technique in gradient searching that is equivalent to adding noise to the system, i.e., dithering. Note that the leakage factor is not used for data output purposes, but only for tap coefficient adaptation purposes. If no leakage factor is used, the system may potentially converge to an incorrect solution.

It is desirable to limit the range of the operands of the processing device. There is thus a high penalty for operands that approach values that are not implementable by the processing device, i.e., the signal processor (DSP). Thus, the leakage factor maintains the coefficients and gain factors at proper levels for signal processing and calculation purposes.

The operation of the equalizer will now be described in more detail and a mathematical model will be presented. The equalizer of the present invention can be described mathematically by the equations that follow.

$$z(t) = \sum_{m=1}^{M} g_m \sum_{i=I(m)+1}^{I(m+1)} c_i y(t-i) + \sum_{l=1}^{L} k_l \sum_{j=J(l)+1}^{J(l+1)} d_j â(t-j) \quad (1)$$

wherein
z(t) is the soft decision output by the summer 34 (FIG. 2);
y(t) is the data input to the equalizer;
$g_m$ is the gain factor of the $m^{th}$ section of the FFE;
$c_{I(m)+1} \ldots C_{I(m+1)}$ are the taps of the $m^{th}$ section of the FFE;
$k_l$ is the gain factor of the $l^{th}$ section of the DFE;
$d_{J(l)+1} \ldots C_{J(l+1)}$ are the taps of the $l^{th}$ section of the DFE;
â(t) is the hard decision sequence output of the equalizer generated by the symbol slicer 40 (FIG. 2);
M is the number of FFE sections and is greater than or equal to zero;
L is the number of DFE sections and is greater than of equal to zero;
Note that the case of L=0 is the case of feed forward equalization, i.e., without decision feedback-equalization.

The parameters of the $m^{th}$ section of the FFE and the $l^{th}$ section of the DFE are adjusted in accordance with the following equations.

$$c_i(t+1) = c_i(t) - \delta_i^c(t) g_m^*(t) e(t) y^*(t-i) + \Psi(c_i(t)) \quad (2)$$

$$g_m(t+1) = g_m(t) - \delta_m^g(t) e(t) \left( \sum_{i=I(m)+1}^{I(m+1)} c_i y(t-i) \right)^* + \Omega(g_m(t)) \quad (3)$$

$$d_j(t+1) = d_j(t) - \delta_j^d(t) k_l^*(t) e(t) â''(t-j) + \Phi(d_j(t)) \quad (4)$$

-continued $$k_l(t+1) = k_l(t) - \delta_l^k(t)e(t)\left(\sum_{j=J(l)+1}^{J(l+1)} d_j\hat{a}(t-j)\right)^* + \Omega(k_l(t)) \quad (5)$$

where $$e(t) = z(t) - \hat{a}(t) \quad (6)$$

and

[*] denotes complex conjugate;

x(t) denotes the value of the entity x after the equalizer processes the $t^{th}$ symbol;

$\delta_i^c(t), \delta_j^d(t), \delta_m^g(t), \delta_l^k(t)$ are adaptive step sizes;

$\Psi(\cdot), \Phi(\cdot), \Omega(\cdot)$ are tap leakage functions for the FFE taps, DFE taps, and gain factors respectively;

$g_i$ and $k_j$ in Equations 2 and 4 represent the gain factors in the equalizer sections that contain $c_i$ and $d_j$, respectively. Adjustment of the gain factors is equivalent to adjusting the step size of the equalizer section.

Note that for the case of the FFE sections the leakage function in the adaptive multiplier is represented by the $\Psi$ function in Equation 2. For the case of the DFE sections the leakage function is represented by the $\Omega$ function in Equation 3.

It is important to note that the equalizer of the present invention has applications in a Vestigial Side Band (VSB) receiver, in which case all the signals and the coefficients are real valued, and in a QAM, PSK, or CAP receiver, in which case the signals and the coefficients of the equalizer are complex valued.

As described hereinabove, the equalizer of the present invention has several advantages over prior art DFE equalizers. The main advantages will now be described.

First, the equalizer of the present invention is divided into a plurality of sections. Second, each section of the equalizer has its own gain coefficient and tap coefficients, wherein prior art DFEs have only taps. This permits rapid tracking of the delay variation of signal reflections that can be compensated for by modifying the gain of the corresponding sections only, the taps are changed in a relatively slow manner.

Third, each equalizer section has its own step sizes that are independent of the step sizes of other sections. This permits the equalizer controller 30 (FIG. 2) to increase the step sizes associated with a particular equalizer section that need to be adjusted in order to quickly track channel variations. Thus, the step sizes associated with a particular equalizer section are increased but without increasing the step sizes in other sections and without sacrificing equalizer stability and jitter.

Figure 6:
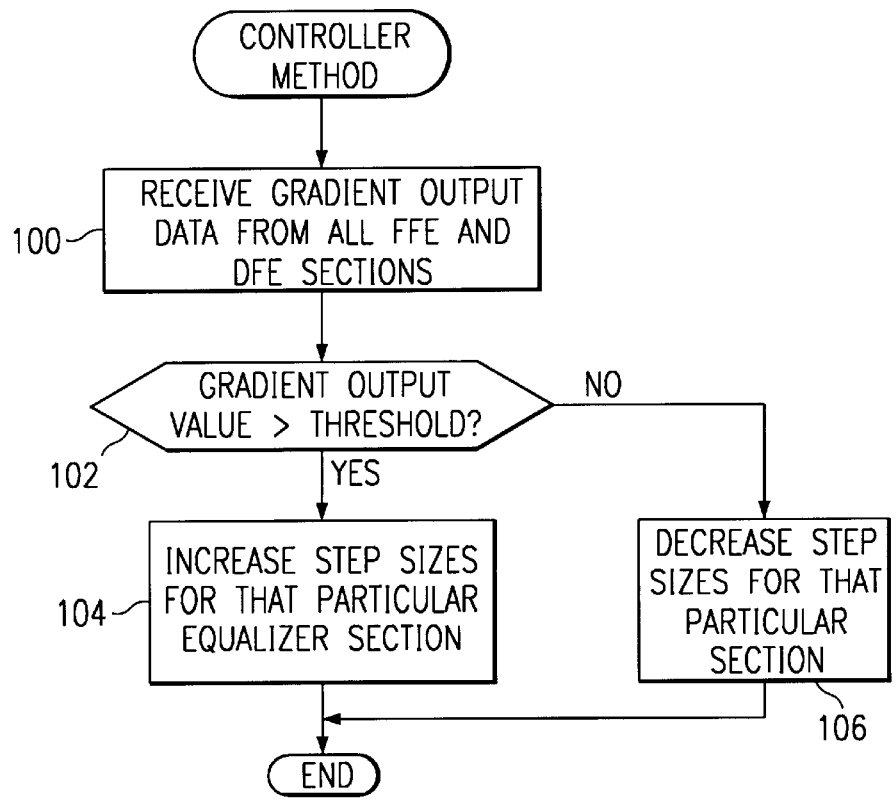
FIG. 6 is a logical flow diagram illustrating the method of monitoring the gradient output of each equalizer section and determining the step size for each one therefrom.

A logical flow diagram illustrating the method of monitoring the gradient output of each equalizer section and determining the step size for each one therefrom is shown in FIG. 6. As describe hereinabove, one of the ways in which the FFE and DFE equalizer sections can be adjusted is by monitoring the gradient outputs of all the equalizer sections in the equalizer controller 30 (FIG. 2). The gradient outputs are received from each FFE and DFE section by periodically polling each section or by each section periodically transmitted its gradient output data to the controller (step 100). Each gradient output is then compared to a predetermined threshold (step 102). Note that the threshold may be dynamically changing in accordance with some criteria.

If the gradient output from a section exceeds the threshold, than the step sizes for that particular equalizer section are increased (step 104) while if the gradient output did not exceed the threshold, the step sizes of that particular section are decreased (step 106).

Note that other controller method may be used to adjust the step size of the equalizer sections without departing from the scope of the present invention.

An example application of the equalizer of the present invention will now be presented. Consider the case of a VSB signal transmitted at a RF frequency of 600 MHz by a transmitter that is compliant with the Digital Television Standard of the ATSC. The RF signal propagates through a channel with a single reflection from a flying airplane. The signal can be represented as described below in Equation 7.

$$\delta(t) + A\delta(t - \tau(t)) \quad (7)$$

where

A is the amplitude of the reflections;

$$\tau(t) = \frac{x_0 + 2vt}{c}$$

is the time delay of the reflection;

$x_0$ is the initial position of the airplane;

v is the Doppler-speed of the airplane towards the receiver and the transmitter;

c is the speed of light (approximately $3 \times 10^8$ meters/sec). The signal is downconverted to baseband and low pass filtered. The baseband signal can be approximated by the following equation.

$$y(t) = \sum_n a_n\left[r(t-nT) + A\cos\left(2\pi\frac{f_{RF}}{c}(x_0+2vt)\right)r\left(t-nT-\frac{x_0+2vt}{c}\right)\right] \quad (8)$$

where

T is the period of a symbol;

r(t) is the convolution of the impulse responses of the transmission pulse at the transmitter with the low pass filter at the receiver;

Wherein it is assumed the channel is noiseless and perfect carrier phase synchronization exists between the receiver and the transmitter.

Assuming a RF frequency $f_{RF}$ of 600 MHz and a Doppler speed of v=150 m/sec, the second term in Equation 8 oscillates at a rate of about 600 Hz, i.e., changes sign every 8,500 symbols at an ATV symbol rate of 10.76 Msps. A standard prior art equalizer for an ATV signal would typically require hundreds of coefficients thus making it very difficult to track such a fast change because so many coefficients must be adjusted.

With the equalizer of the present invention, however, it is possible to track this magnitude channel variation by only adjusting the gain parameter of the appropriate equalizer section or sections, i.e., only one or two coefficients, and thus it is possible to achieve much better tracking capability without sacrificing stability.

Beyond equalization of communications signals, the present invention is also applicable as an adaptive filter that is capable of tracking relatively fast variations in the linear distortion of the signal without sacrificing stability and accuracy. Such a filter can be adapted to function as an echo canceler, with particular application to acoustic echo cancellation. Such a filter can also be applied as a predicting and smoothing filter, such as in noise cancellation applications.

Figure 7:
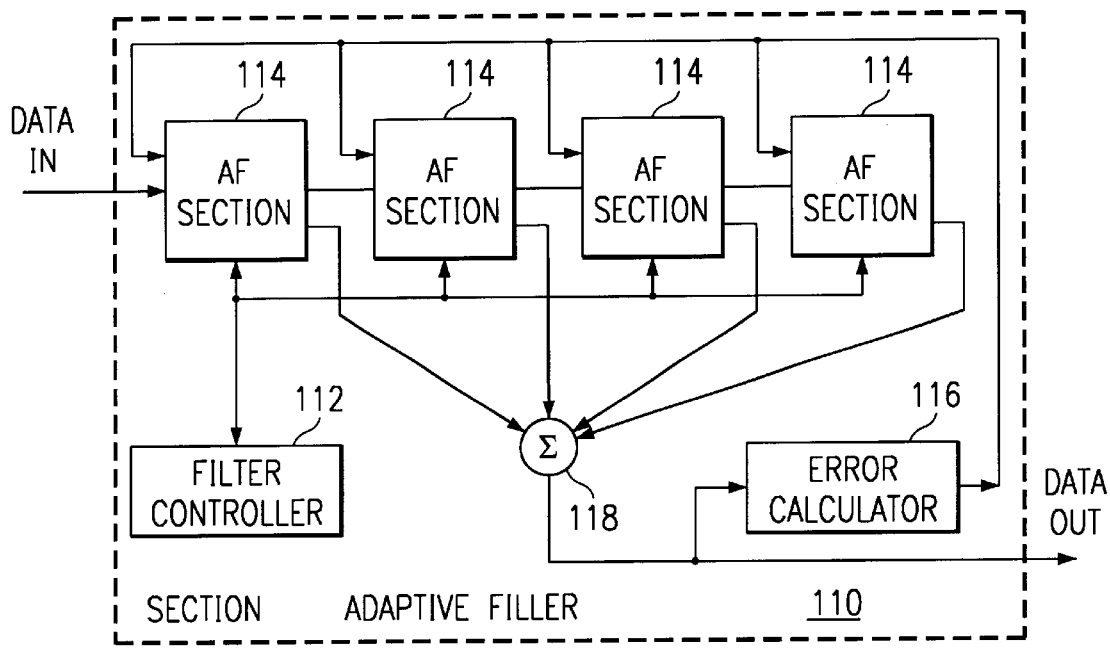
FIG. 7 is a block diagram illustrating a sectioned adaptive filter constructed in accordance with the present invention capable of fast tracking of signal containing time varying reflections.

A block diagram illustrating a sectioned adaptive filter constructed in accordance with the present invention capable of fast tracking of signal containing time varying reflections is shown in FIG. 7. The filter, generally reference 110, differs from the equalizer of FIG. 2 in that it does not include any DFE sections or a slicer. In addition, the FFE sections of the equalizer are replaced with adaptive filter sections 114. The filter also comprises an error calculator 116, summer 118 and a filter controller 112.

Figure 8:
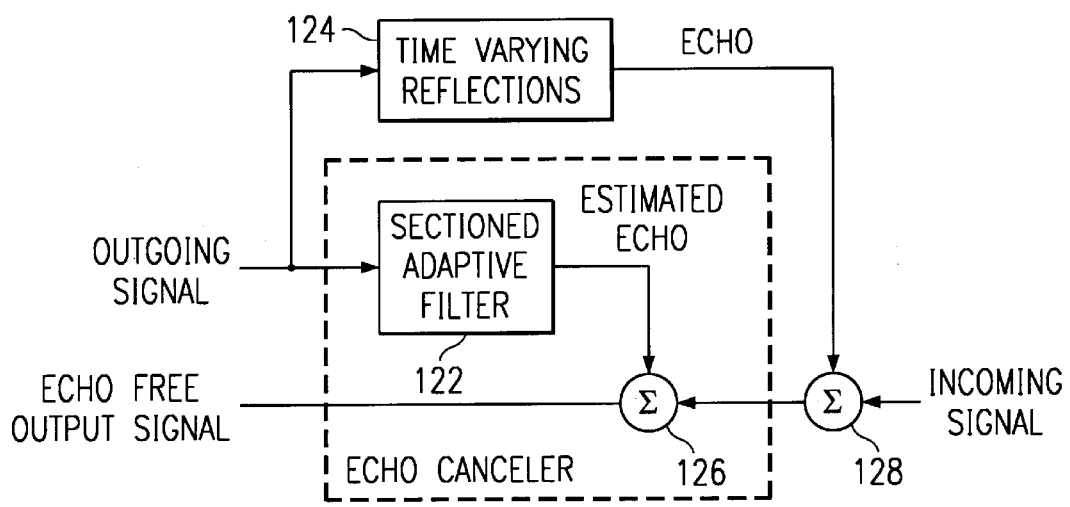
FIG. 8 is a block diagram illustrating the architecture of a typical echo canceler that includes a sectional adaptive filter of the present invention.

A block diagram illustrating the architecture of a typical echo canceler that includes a sectioned adaptive filter of the present invention is shown in FIG. 8. The echo canceler, generally reference 120, comprises a sectioned adaptive filter, summers 126, 128 and a block 124 representing time varying reflections.

The inputs to the echo canceling device 120 are the outgoing signal and the sum of the desired incoming signal and an echo signal that comprises the time varying reflections of the outgoing signal (block 124). The echo canceling device 120 is adapted to process the outgoing signal and generate an estimated echo which is added to the incoming signal to generate an echo free signal. The adaptive filter 122 filters the outgoing signal using an adaptive filter that may have a large number of taps, e.g., 1000 taps in acoustic echo canceling applications. In addition, the adaptive filter 122 functions to track relatively fast time variations in the reflections.

In order to achieve fast tracking without sacrificing stability, the echo-canceling device 120 employs a sectioned adaptive filter 122. The error calculator 116 (FIG. 7) functions to generate an error signal that is the difference between the echo free signal and en estimate of the incoming signal, e.g., zero when there is assumed to be no incoming signal.

While the invention has been described with respect to a limited number of embodiments, it will be appreciated that many variations, modifications and other applications of the invention may be made.

What is claimed is:

1. An adaptive equalizer having an input and an output, said equalizer for equalizing a receiver signal input thereto, comprising:

a plurality of feed forward equalizer (FFE) sections, at least one feed forward equalizer section having tap coefficients and step size parameters that are adjustable separately for each said feed forward equalizer section independent of the tap coefficients and step size parameters of other feed forward equalizer sections, wherein said feed forward equalizer section comprises:

a linear adaptive digital filter operating on said input of said equalizer delayed in time and generating an output therefrom, said linear adaptive digital filter including a plurality of coefficients;

an adaptive gain multiplier operating on said output of said linear adaptive digital filter, said adaptive gain multiplier including a gain coefficient;

a first step size parameter for adapting said plurality of coefficients of said linear adaptive digital filter;

a second step size parameter for adapting said gain coefficient of said adaptive gain multiplier; and wherein said first step size parameter and said second step size parameter are set independently for each said FFE section;

a plurality of decision feedback equalizer (DFE) sections, at least one decision feedback equalizer section having tap coefficients and step size parameters that are adjustable separately for each said decision feedback equalizer section independent of the tap coefficients and step size parameters of other decision feedback equalizer sections;

a summation unit operatively coupled to the outputs of said plurality of FFE sections and said plurality of DFE sections, said summation unit adapted to add said outputs so as to generate a soft decision output;

a symbol slicer operatively coupled to the output of said summation unit and adapted to generate estimated symbols yielding a hard decision output;

an error calculation unit operatively coupled to the output of said summation unit adapted to generate an estimated error signal; and a controller operatively coupled to said plurality of FFE sections and said plurality of DFE sections, said controller adapted to generate said step size parameters for each FFE section and DFE section in response to sensing variations in the linear distortion of said receiver signal which can be compensated for by said FFE and said DFE sections.

2. The adaptive equalizer according to claim 1, wherein said linear adaptive digital filter comprises a plurality of tapped delay line cells.

3. The adaptive equalizer according to claim 1, wherein said decision feedback equalizer section comprises:

a linear adaptive digital filter operating on said estimated symbols delayed in time and generating an output therefrom, said linear adaptive digital filter including a plurality of coefficients;

an adaptive gain multiplier operating on said output of said linear adaptive digital filter, said adaptive gain multiplier including a gain coefficient;

a first step size parameter for adapting said plurality of coefficients of said linear adaptive digital filter;

a second step size parameter for adapting said gain coefficient of said adaptive gain multiplier; and wherein said first step size parameter and said second step size parameter are set independently for each said DFE section.

4. The adaptive equalizer according to claim 3, wherein said linear adaptive digital filter comprises a plurality of tapped delay line cells.

5. The adaptive equalizer according to claim 1, wherein said controller comprises processing means programmed to:

sense the magnitudes of gradient outputs generated by each said FFE section and each said DFE section; and adjust the step size parameters within those FFe and DFE sections having high gradient magnitudes so as to allow fast adjustment of tap coefficients.

6. The adaptive equalizer according to claim 1, wherein said controller comprises processing means programmed to:

monitors the tap coefficients associated with each said FFE section and each said DFE section;

detect the time variation of said coefficients;

normalize the time variation with the step size parameters for a section;

adjust the step size parameters within those FFE and DFE sections having large time variations so as to allow fast adjustment of tap coefficients.

7. The adaptive equalizer according to claim 1, wherein said controller comprises processing means programmed to:

set large values for the step size parameters in a FFE or DFE section that is expected to have large or fast time varying tap coefficients; and set small values for the step size parameters in a FFE or DFE section that is expected to have small or slow time varying tap coefficients.

8. The adaptive equalizer according to claim 1, wherein the tap coefficients of each FFE section are adapted in accordance with the cross correlation between the input to said FFE section and said estimated error signal.

9. The adaptive equalizer according to claim 1, wherein said gain coefficient of each FFE section is adapted in accordance with the cross correlation between the input to said adaptive gain multiplier and said estimated error signal.

10. The adaptive equalizer according to claim 1, wherein the tap coefficients of each DFE section are adapted in accordance with the cross correlation between the input to said DFE section and said estimated error signal.

11. The adaptive equalizer according to claim 3, wherein said gain coefficient of each DFE section is adapted in accordance with the cross correlation between the input to said adaptive gain multiplier and said estimated error signal.

12. The adaptive equalizer according to claim 1, wherein the tap coefficients in each FFE section are adapted such that they converge to a solution wherein the magnitudes of the tap coefficients are close to a predetermined value.

13. The adaptive equalizer according to claim 1, wherein the tap coefficients in each DFE section are adapted such that convergence is achieved to a solution wherein their magnitudes are close to a predetermined value.

14. The adaptive equalizer according to clam 1, wherein the gain coefficient of said adaptive gain multiplier is adapted such that convergence is achieved to a solution wherein its magnitude is close to a predetermined value.

15. The adaptive equalizer according to claim 3, wherein the gain coefficient of said adaptive gain multiplier is adapted such that convergence is achieved to a solution wherein its magnitude is close to a predetermined value.

16. The adaptive equalizer according to claim 1, wherein the plurality of coefficients of said linear adaptive digital filter and said gain coefficient of said adaptive gain multiplier comprise real values.

17. The adaptive equalizer according to claim 3, wherein the plurality of coefficients of said linear adaptive digital filter and said gain coefficient of said adaptive gain multiplier comprise real values.

18. The adaptive equalizer according to claim 1, wherein the plurality of coefficients of said linear adaptive digital filter and said gain coefficient of said adaptive gain multiplier comprise complex values.

19. The adaptive equalizer according to claim 3, wherein the plurality of coefficients of said linear adaptive digital filter and said gain coefficient of said adaptive gain multiplier comprise complex values.

20. An adaptive filter having an input and an output, said filter for filtering an input signal, comprising:

a plurality of filter sections, at least one filter section having tap coefficients and step size parameters that are adjustable separately for each said filter section independent of the tap coefficients and step size parameters of other filter sections, wherein said filter section comprises:

a linear adaptive digital filter operating on said input of said adaptive filter delayed in time and generating an output therefrom, said linear adaptive digital filter including a plurality of coefficients;

an adaptive gain multiplier operating on said output of said linear adaptive digital filter, said adaptive gain multiplier including a gain coefficient;

a first step size parameter for adapting said plurality of coefficients of said linear adaptive digital filter;

a second step size parameter for adapting said gain coefficient of said adaptive gain multiplier; and wherein said first step size parameter and said second step size parameter are set independently for each said filter section;

a summation unit operatively coupled to the outputs of said plurality of filter sections, said summation unit adapted to add said outputs so as to generate a soft decision output;

an error calculation unit operatively coupled to the output of said summation unit adapted to generate an estimate error signal; and a controller operatively coupled to said plurality of filter sections, said controller adapted to generate said step size parameters for each filter section in response to sensing variations in the linear distortion of said input signal which can be compensated for by said filter sections.

* * * * *